(12) United States Patent
Frey et al.

(10) Patent No.: US 7,968,804 B2
(45) Date of Patent: *Jun. 28, 2011

(54) METHODS OF PATTERNING A DEPOSIT METAL ON A SUBSTRATE

(75) Inventors: Matthew H. Frey, Cottage Grove, MN (US); Tracie J. Berniard, St. Paul, MN (US); Roxanne A. Boehmer, Inver Grove Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 313 days.

This patent is subject to a terminal disclaimer.

(21) Appl. No.: 11/613,368

(22) Filed: Dec. 20, 2006

(65) Prior Publication Data
US 2008/0150148 A1    Jun. 26, 2008

(51) Int. Cl.
*H05K 9/00* (2006.01)

(52) U.S. Cl. ....... 174/392; 174/250; 174/389; 427/98.1; 427/301; 427/305; 427/306; 427/404; 430/307; 430/314; 430/315

(58) Field of Classification Search .......... 428/209, 428/161, 901; 174/250, 392, 389, 254; 427/98.1, 427/301, 305, 306, 404; 430/307, 314, 315
See application file for complete search history.

(56) References Cited

U.S. PATENT DOCUMENTS

| | | |
|---|---|---|
| 2,963,748 A | 12/1960 | Young |
| 3,075,280 A | 1/1963 | Jack |
| 3,620,933 A | 11/1971 | Grunwald et al. |
| 3,800,020 A | 3/1974 | Parfet |
| 3,891,514 A | 6/1975 | Klemm |
| 3,952,152 A | 4/1976 | Lill et al. |
| 4,179,797 A | 12/1979 | Johnson |
| 4,321,296 A | 3/1982 | Rougier |
| 4,381,421 A | 4/1983 | Coats et al. |
| 4,412,255 A | 10/1983 | Kuhlman et al. |
| 4,510,347 A | 4/1985 | Wiech, Jr. |
| 4,552,615 A | 11/1985 | Amendola et al. |
| 4,576,850 A | 3/1986 | Martens |
| 4,614,837 A | 9/1986 | Kane et al. |
| 4,748,130 A | 5/1988 | Wenham et al. |
| 4,775,611 A | 10/1988 | Sullivan |
| 4,869,930 A | 9/1989 | Clarke et al. |
| 4,915,780 A | 4/1990 | Beckett |
| 5,061,438 A | 10/1991 | Lillie et al. |
| 5,094,811 A | 3/1992 | Kane et al. |

(Continued)

FOREIGN PATENT DOCUMENTS

DE 3832299 3/1990

(Continued)

OTHER PUBLICATIONS

U.S. Appl. No. 11/550,542, filed Oct. 18, 2006; Titled: *Methods of Patterning a Material on Polymeric Substrates*.

(Continued)

*Primary Examiner* — Cathy Lam
(74) *Attorney, Agent, or Firm* — Gregory D. Allen

(57) ABSTRACT

An article includes a polymeric film having a major surface, a discontinuous layer of a catalytic material on the major surface, and a metal pattern on the catalytic material. The discontinuous layer of catalytic material has an average thickness of less than 200 angstroms. Methods of forming these articles are also disclosed.

19 Claims, 3 Drawing Sheets

U.S. PATENT DOCUMENTS

| | | | |
|---|---|---|---|
| 5,399,879 | A | 3/1995 | Liu |
| 5,462,624 | A | 10/1995 | Kwon |
| 5,512,131 | A | 4/1996 | Kumar |
| 5,595,943 | A | 1/1997 | Itabashi et al. |
| 5,900,160 | A | 5/1999 | Whitesides |
| 5,932,150 | A | 8/1999 | Lacey |
| 6,048,623 | A | 4/2000 | Everhart |
| 6,121,150 | A | 9/2000 | Avanzino et al. |
| 6,180,239 | B1 | 1/2001 | Whitesides |
| 6,433,481 | B1 | 8/2002 | Marutsuka |
| 6,518,168 | B1 | 2/2003 | Clem |
| 6,582,767 | B1 | 6/2003 | Fukushima et al. |
| 6,599,824 | B1 | 7/2003 | Krivokapic |
| 6,737,170 | B2 | 5/2004 | Fitch et al. |
| 6,776,094 | B1 | 8/2004 | Whitesides |
| 6,788,463 | B2 | 9/2004 | Merrill et al. |
| 6,828,581 | B2 * | 12/2004 | Zangmeister et al. ......... 257/40 |
| 6,875,475 | B2 | 4/2005 | Moran et al. |
| 6,911,385 | B1 * | 6/2005 | Haubrich et al. ............. 438/610 |
| 7,001,658 | B2 * | 2/2006 | Bourdelais et al. ........... 428/188 |
| 7,041,232 | B2 | 5/2006 | Bietsch et al. |
| 7,160,583 | B2 | 1/2007 | Frey |
| 7,244,669 | B2 | 7/2007 | Sirringhaus et al. |
| 7,299,547 | B2 * | 11/2007 | Choi et al. ...................... 29/846 |
| 7,442,316 | B2 * | 10/2008 | Jeong et al. ..................... 216/11 |
| 7,582,509 | B2 | 9/2009 | Li et al. |
| 7,585,424 | B2 | 9/2009 | Mei |
| 2007/0036951 | A1 | 2/2007 | Nguyen et al. |
| 2007/0049130 | A1 | 3/2007 | Kojima et al. |
| 2007/0095469 | A1 | 5/2007 | Burdinski |
| 2008/0095988 | A1 | 4/2008 | Frey et al. |
| 2008/0182079 | A1 | 7/2008 | Mirkin et al. |

FOREIGN PATENT DOCUMENTS

| | | |
|---|---|---|
| GB | 2247784 | 3/1992 |
| GB | 2381274 | 4/2003 |
| WO | WO 97/34025 | 9/1997 |
| WO | WO 00/79023 | 12/2000 |
| WO | WO 03/049176 | 6/2003 |
| WO | WO 2004/055919 | 7/2004 |
| WO | WO 2004/055920 | 7/2004 |
| WO | WO 2006/062575 | 6/2006 |

OTHER PUBLICATIONS

U.S. Appl. No. 11/550,626, filed Oct. 18, 2006; Titled: *Methods of Patterning a Deposit Metal on a Polymeric Substrate*.

Sard, R., "The Nucleation, Growth, and Structure of Electroless Copper Deposits", *Journal of the Electrochemical Society*, vol. 117, No. 7, pp. 864-870 (1970).

V. Svorcik, at al., "Characterization of Evaporated and Sputtered Thin Au Layers on Poly-ethylene terephtalate)," Journal of Applied Polymer Science, 99 1698-1704 (2006).

M. Geissler, at al., Direct Patterning of NiB on Glass Substrates Using Microcontact Printing and Electroless Deposition, Langmuir, vol. 19, No. 15, pp. 6283-6296, 2003.

N. Jeon, at al., "Patterned Self-Assembled Monolayers Formed by Microcontact Printing Direct Selective Metalization by Chemical Vapor Deposition on Planar and Nonplanar Substrates," Langmuir, vol. 11, No. 8, pp. 3024-3026, 1995.

B. Michel, et al., "Printing Meets Lithography: Soft Approaches to High-Resolution Patterning," IBM Journal of Research and Development, vol. 45, No. 5, pp. 697-719 (2001).

A. Ulman, "Formation and Structure of Self-Assembled Monolayers," Chem. Rev. 96 1533-1554 (1996).

Pellerite et al. (M.J. Pellerite, T.D. Dunbar, L.D. Boardman, and E.J. Wood, "Effects of Fluorination on Self-Assembled Monolayer Formation from Alkanephosphonic Acids on Aluminum: Kinetics and Structure," Journal of Physical Chemistry B 107 11726-11736 (2003).

Carcia et al., 2005, *Journal of the SID* 13(7):547-554 "Oxide engineering of ZnO thin-film transistors for flexible electronics".

* cited by examiner

METHODS OF PATTERNING A DEPOSIT METAL ON A SUBSTRATE

FIELD

The present disclosure relates generally to methods of patterning a deposit metal on a substrate and articles formed by such methods.

BACKGROUND

Substrates with patterns of metallic material have a wide variety of commercial applications. In some instances, it is desired that a conductive grid be sufficiently fine to be invisible to the unaided eye and supported on a transparent polymeric substrate. Transparent conductive sheets have a variety of uses including, for example, resistively heated windows, electromagnetic interference (EMI) shielding layers, static dissipating components, antennas, touch screens for computer displays, and surface electrodes for electrochromic windows, photovoltaic devices, electroluminescent devices, and liquid crystal displays.

The use of essentially transparent electrically conductive grids for such applications as EMI shielding is known. The grid can be formed from a network or screen of metal wires that are sandwiched or laminated between transparent sheets or embedded in substrates (U.S. Pat. Nos. 3,952,152; 4,179,797; 4,321,296; 4,381,421; and 4,412,255). One disadvantage of using wire screens is the difficulty in handling very fine wires or in making and handling very fine wire screens. For example, a 20 micrometer diameter copper wire has a tensile strength of only 1 ounce (28 grams force) and is therefore easily damaged. Wire screens fabricated with wires of 20 micrometer diameter are available but are expensive due to the difficulty in handling very fine wire.

Rather than embed a preexisting wire screen into a substrate, a conductive pattern can be fabricated in-situ by first forming a pattern of grooves or channels in a substrate and then filling the grooves or channels with a conductive material. This method has been used for making conductive circuit lines and patterns by a variety of means, although usually for lines and patterns on a relatively coarse scale. The grooves can be formed in the substrate by molding, embossing, or by lithographic techniques. The grooves can then be filled with conductive inks or epoxies (U.S. Pat. No. 5,462,624), with evaporated, sputtered, or plated metal (U.S. Pat. Nos. 3,891,514; 4,510,347; and 5,595,943), with molten metal (U.S. Pat. No. 4,748,130), or with metal powder (U.S. Pat. Nos. 2,963,748; 3,075,280; 3,800,020; 4,614,837; 5,061,438; and 5,094,811). Conductive grids on polymer films have been made by printing conductive pastes (U.S. Pat. No. 5,399,879) or by photolithography and etching (U.S. Pat. No. 6,433,481). These prior art methods have limitations. For example, one problem with conductive inks or epoxies is that the electrical conductivity is dependent on the formation of contacts between adjacent conductive particles, and the overall conductivity is usually much less than that of solid metal. Vapor deposition of metal or electroplating is generally slow and often requires a subsequent step to remove excess metal that is deposited between the grooves. Molten metal can be placed in the grooves but usually requires the deposition of some material in the grooves that the metal will wet. Otherwise the molten metal will not penetrate nor stay in the grooves due to surface tension of the molten metal.

In addition to conductive grids, substrates supporting patterns of conductive materials in the form of electrical circuits are also useful. Flexible circuitry is used in the support and interconnection of electronic components, as well as in the fabrication of sensors. Examples of sensors include environmental sensors, medical sensors, chemical sensors, and biometric sensors. Some sensors are preferably transparent. As in the case of conductive grids, flexible circuits on polymer film substrates are often fabricated using photolithography, which includes multiple steps of photoresist placement, exposure, development, and removal. Alternative methods that do not require such expensive equipment and so many fabrication process steps are desired in the industry.

Circuits have been made by placing metal powder into grooves followed by compacting the powder to enhance electrical contact between the particles. Lillie et al. (U.S. Pat. No. 5,061,438) and Kane et al. (U.S. Pat. No. 5,094,811) have used this method to form printed circuit boards. However, these methods are not practical for making fine circuits and fine metal patterns. On a fine scale, replacing or re-registering the tool over the embossed pattern to perform the metal compaction can be difficult. For example, a sheet with a pattern of 20 micrometer wide channels would require that the tool be placed over the pattern to an accuracy of roughly 3 micrometers from one side of the sheet to the other. For many applications, the sheet may be on the order of 30 cm by 30 cm. Dimensional changes due to thermal contraction of a thermoplastic sheet are typically about 1 percent or more during cooling from the forming temperature to room temperature. Thus, for a 30 cm by 30 cm sheet, a contraction of 1 percent would result in an overall shrinkage of 0.3 cm. This value is 1000 times larger than the 3 micrometer placement accuracy needed, making accurate repositioning of the tool difficult.

BRIEF SUMMARY

The present disclosure relates to methods of patterning a deposit metal on a substrate. In particular, the present disclosure relates to methods of patterning a deposit metal on a polymeric film or substrate by selectively transferring functionalizing molecules onto regions of a metal vapor catalyzed substrate with, for example, a printing plate and then electrolessly depositing a metal onto unfunctionalized regions. This approach allows fine-scale additively patterned conductive deposits that are electrically isolated, and are complemented by regions that are substantially optically transparent, without a post-etch step.

In a first embodiment a method of patterning a deposit metal on a substrate includes providing a substrate having a major surface, vapor depositing a catalytic material at an average thickness of less than 60 angstroms onto the major surface of the substrate to form an activated substrate surface, printing a pattern of functionalizing molecules on the activated substrate surface to form at least one functionalized region and at least one unfunctionalized region, and depositing electrolessly a deposit metal selectively on the unfunctionalized region to form a deposit metal patterned substrate.

In another embodiments a method of patterning a deposit metal on a substrate includes providing a substrate having a major surface, depositing a discontinuous layer of a catalytic material at an average thickness of less than 200 angstroms onto the major surface of the substrate to form an activated substrate surface, printing a pattern of functionalizing molecules on the activated substrate surface to form at least one functionalized region and at least one unfunctionalized region, and depositing electrolessly a deposit metal selectively on the unfunctionalized region to form a deposit metal patterned substrate.

In another embodiment an article includes a polymeric film having a major surface, a discontinuous layer of a catalytic material on the major surface, and a metal pattern on the catalytic material. The discontinuous layer of catalytic material has an average thickness of less than 200 angstroms.

BRIEF DESCRIPTION OF THE DRAWINGS

The invention may be more completely understood in consideration of the following detailed description of various embodiments of the invention in connection with the accompanying drawings, in which.

Figure 1A:
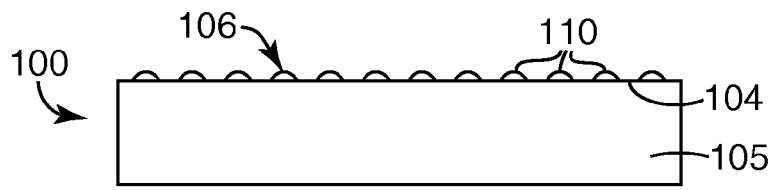
FIGS. 1A-1F is a schematic diagram of an illustrative method of patterning a material on a polymeric substrate.
Figure 1B:
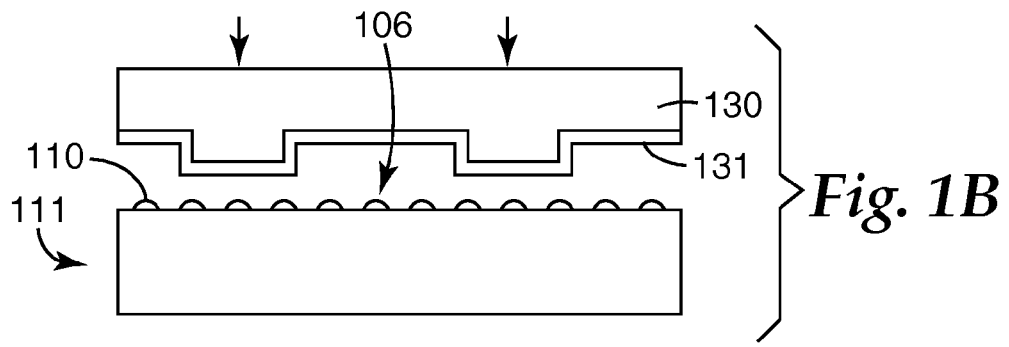
Figure 1C:
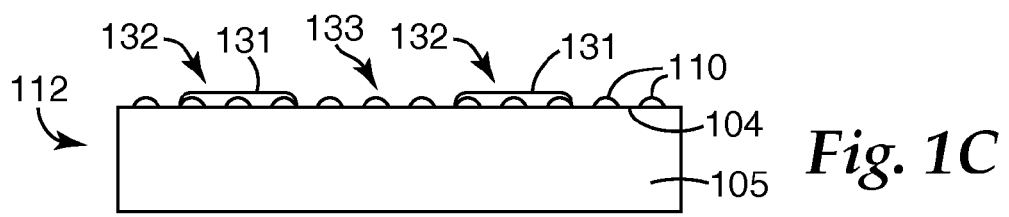
Figure 1D:
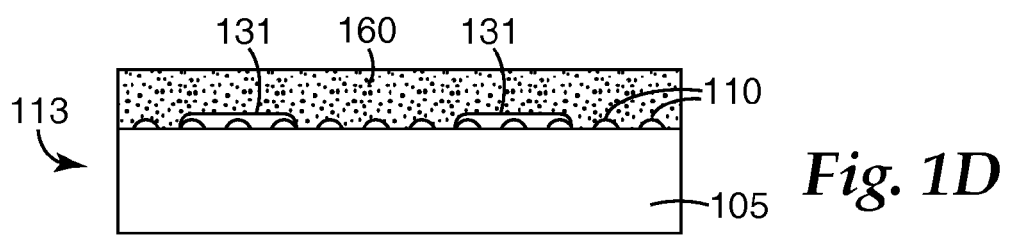
Figure 1E:
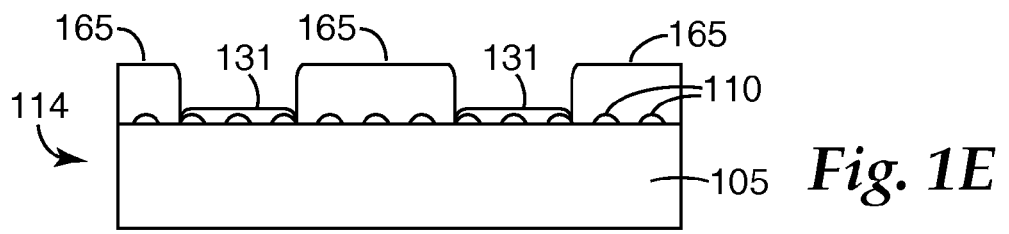
Figure 1F:
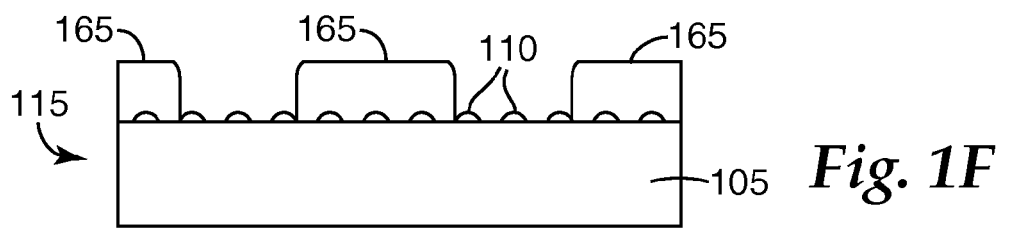
Figure 2A:
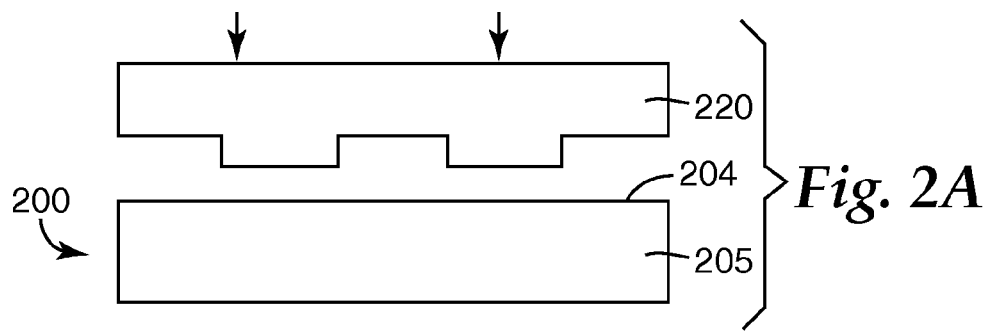
FIGS. 2A-2H is a schematic diagram of another illustrative method of patterning a material on a polymeric substrate.
Figure 2B:
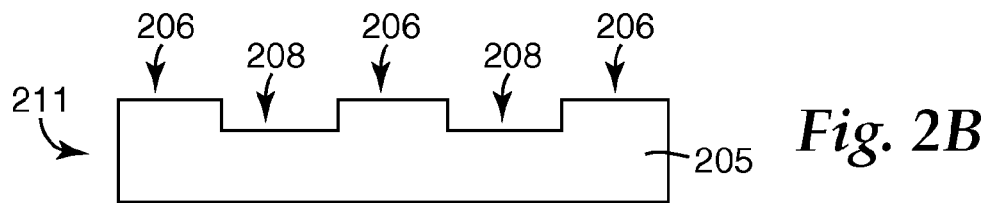
Figure 2C:
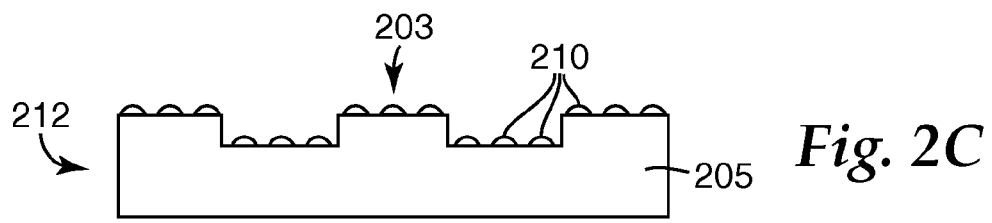
Figure 2D:
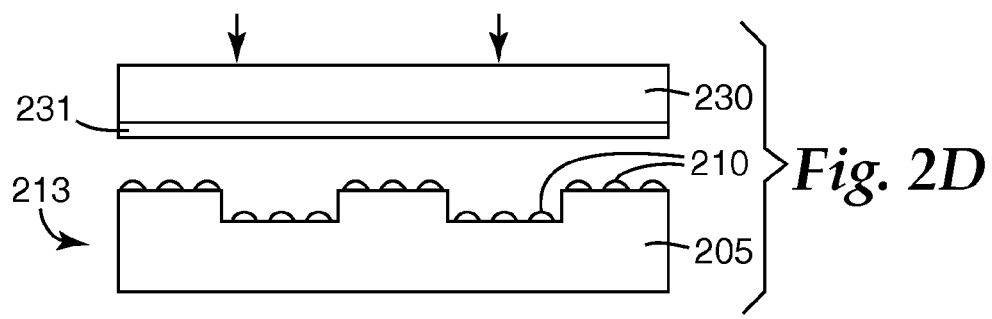
Figure 2E:
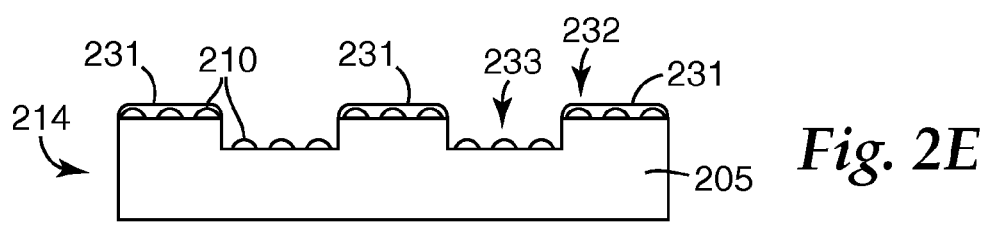
Figure 2F:
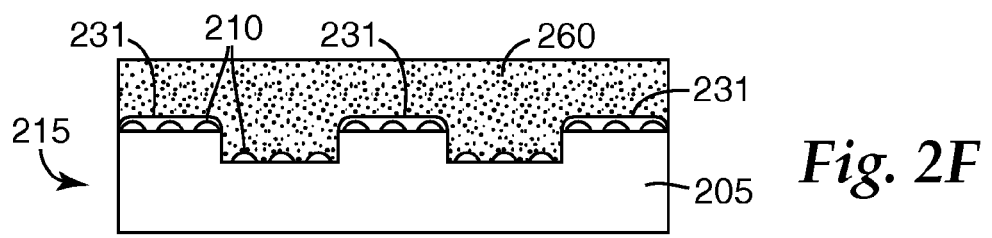
Figure 2G:
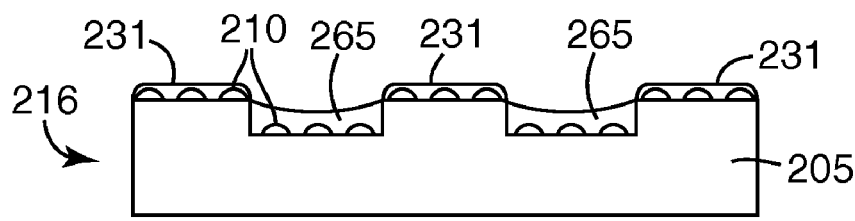
Figure 2H:
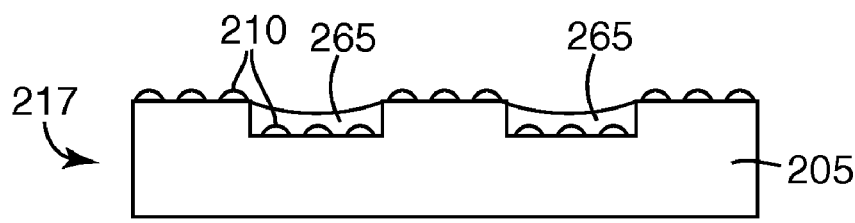

The figures are not necessarily to scale. Like numbers used in the figures refer to like components, steps and the like. However, it will be understood that the use of a number to refer to a component in a given figure is not intended to limit the component in another figure labeled with the same number.

DETAILED DESCRIPTION

In the following description, reference is made to the accompanying drawings that form a part hereof, and in which are shown by way of illustration several specific embodiments. It is to be understood that other embodiments are contemplated and may be made without departing from the scope or spirit of the present invention. The following detailed description, therefore, is not to be taken in a limiting sense.

The present disclosure relates to methods of patterning a deposit metal on a substrate. In particular, the present disclosure relates to methods of patterning a deposit metal on a polymeric film or substrate by selectively transferring a functionalizing molecules onto regions of a metal vapor catalyzed substrate with, for example, a printing plate and then electrolessly depositing a metal onto unfunctionalized regions. This approach allows fine-scale additively patterned conductive deposits that are electrically isolated, and are complemented by regions that are substantially optically transparent, without a post-etch step. While the present invention is not so limited, an appreciation of various aspects of the invention will be gained through a discussion of the example provided below.

The present disclosure solves at least one little-recognized problem in the patterning of electrolessly deposited metals on insulating, transparent polymeric film substrates. A problem arises when one aims to pattern electrolessly deposited metals on transparent substrates bearing a catalytic metal that is contact-masked with functionalizing molecules, and when it is desired for the regions between conductor regions to be light-transmitting and electrically non-conductive, without the use of an etching step. It is generally desired for the reason of manufacturing efficiency when generating metallic conductor patterns on electrically insulating substrates to use as few process steps as possible. Among the process steps often used is etching. Etching, however, is an undesirable process, due to the need to handle hazardous chemicals and due to the possibility for the etchant to damage other materials in the product. For applications where regions between conductors are required to be light-transmitting and electrically non-conductive, the present invention, as compared with previously reported methods, avoids the use of an etching step for the catalytic material in those regions. Specifically, this disclosure includes the use of a catalytic material with average thickness that has been herein determined to deliver a notably useful combination of high sheet resistance (Rs), low impact on photopic transmittance (Tvis), and satisfactory chemical activity to generate a continuous electroless metal deposit, obviating the need to etch the catalytic material from regions between the patterned metal deposit regions.

All scientific and technical terms used herein have meanings commonly used in the art unless otherwise specified. The definitions provided herein are to facilitate understanding of certain terms used frequently herein and are not meant to limit the scope of the present disclosure.

"Region" refers to a contiguous fractional portion of an entire surface, e.g., of a substrate surface. A raised region refers to a surface region that projects away from adjacent regions of the major surface and has a height. A recessed region refers to a surface region that extends inward with respect to adjacent regions of a major surface and has a depth. A raised region and/or a recessed region can be a discrete region, where the adjacent recessed and/or raised region (respectively) surrounds the discrete region on all sides. Alternatively, the raised or recessed region can be a generally contiguous region that extends generally linearly along a length or width of the surface and adjacent regions of the major surface do not surround the contiguous region on all sides. A raised surface region of a substrate is in general that portion of a substrate surface that comes into contact with the flat surface of another object when the substrate surface and the flat surface (i.e., non-structured and planar) of the other object are made to touch, when the flat object is larger in area than the raised region and any adjacent recessed regions. The recessed surface region or regions of a substrate are in general the surface regions complementary to the raised surface regions, as just described. By complementary, what is meant is that all of the raised surface region or regions and all of the recessed surface region or regions combine to define essentially the entire major surface.

Printing a pattern of functionalizing molecules refers to depositing a layer of functionalizing molecules on one surface region and not depositing a layer of functionalizing molecules on another surface region. For a layer of functionalizing molecules to be printed in a pattern on a substrate surface, the layer is not deposited on the entire substrate surface. That is, the layer of functionalizing molecules forms a pattern on the substrate surface. In the case where the functionalizing molecules functionalize a vapor deposited catalytic material that is a discontinuous layer on a substrate surface, the region with a layer of functionalizing molecules deposited thereon may comprise multiple adjacent islands of functionalized catalytic material (e.g., particles of functionalized catalytic material), and the region without a layer of functionalizing molecules deposited thereon may comprise multiple adjacent islands of unfunctionalized catalytic material (e.g., particles of unfunctionalized catalytic material).

A polymeric "film" substrate is a polymer material in the form of a flat sheet that is sufficiently flexible and strong to be processed in a roll-to-roll fashion. A polymeric material in the form of a flat sheet may have a microstructure, or a relief structure, on one or both major surfaces. By roll-to-roll, what is meant is a process where material is wound onto or unwound from a support, as well as further processed in some way. Examples of further processes include coating, slitting, exposing to radiation, or the like. Polymeric films can be manufactured in a variety of thickness, ranging in general from about 5 micrometers to 1000 micrometers. In many embodiments, polymeric film thicknesses range from about 25 micrometers to about 500 micrometers, or from about 50 micrometers to about 250 micrometers, or from about 75 micrometers to about 200 micrometers. For films that include a relief structure on one or both major surfaces, what is meant by thickness of the film is the average thickness across the area of the film.

Depositing a metal "selectively," refers to depositing metal on one surface region and not depositing the metal on another surface region. For a metal to be deposited selectively on a substrate surface, it is not deposited on the entire substrate surface. That is, the deposit metal forms a pattern on the substrate surface.

The terms "deposit metal" and "metallic deposit" and "deposited metal" are used interchangeably and refer to a metal deposited on a substrate. The deposit metal is usually formed from an electroless plating solution. The deposit metal can be in the form of a pattern such as linear traces in an electrical circuit, contact pads on an electrical device, or large-area coatings. Deposit metal can have any useful thickness. In many embodiments, deposit metal thickness can range from 0.1 to 10 micrometers or from 0.1 to 5 micrometers.

An "electrolessly deposited metal" is a metal deposited by electroless deposition (e.g., that includes microstructural signature of electroless deposition). For example, copper deposited electrolessly from formaldehyde baths includes microscopic hydrogen voids, particularly at grain boundaries, that are observable using transmission electron microscopy. Most commercial electroless nickel baths include reducing agents based on hypophosphites, borohydrides, or amine boranes, leading to the presence of boron or phosphorous in the deposit. An electrolessly deposited nickel coating has been reported to include a banded microstructure normal to the growth direction that was observable using optical microscopy. Nickel deposited electrolessly from hypophosphite baths has been reported to include isolated regions of enriched phosphorus, separated by essentially pure nickel. Annealed electroless nickel deposits are reported to include inclusions of nickel boride or nickel phosphide observable, which are observable using transmission electron microscopy.

A "functionalizing molecule" refers to a molecule that attaches to a substrate surface (or coated substrate surface) via chemical bond. The functionalizing molecule can passivate the surface region to which it is attached. By passivate, what is meant is that the attachment of the functionalizing molecules to a surface diminishes the chemical activity of the surface (e.g., catalytic activity for initiating electroless deposition). In many embodiments, the functionalizing molecules form a self-assembled monolayer. In embodiments where material is printed onto an activated substrate surface to serve as a mask for a patterned electroless plating, functionalizing molecules are preferred as the material because they can be printed using elastomeric plates without the need to transfer a bulk liquid (e.g., a bulk liquid ink) from the plate to the substrate surface. On the contrary, functionalizing molecules can be transferred from an elastomeric plate by molecular diffusion of the molecules from within the plate to the interface between the plate and the substrate surface, leading to high pattern fidelity. Such high pattern fidelity is more challenging to achieve by printing bulk inks.

A "self-assembled monolayer" refers to a single layer of molecules that are attached (e.g., by a chemical bond) to a surface and that have adopted a preferred orientation with respect to that surface and even with respect to each other. Self-assembled monolayers have been shown to cover surfaces so completely that the properties of that surface are changed. For example, application of a self-assembled monolayer can result in a surface energy reduction.

Examples of chemical species that are suitable for functionalizing a surface (e.g., in the form of a self-assembled monolayer) include organic compounds such as organosulfur compounds, silanes, phosphonic acids, benzotriazoles, and carboxylic acids. Examples of such compounds are discussed in the review by Ulman (A. Ulman, "Formation and Structure of Self-Assembled Monolayers," Chem. Rev. 96 1533-1554 (1996)). In addition to organic compounds, certain organometallic compounds are useful for functionalizing a surface (e.g., in the form of a self-assembled monolayer). Examples of organosulfur compounds that are suitable for functionalizing a surface (e.g., in the form of a self-assembled monolayer) include alkyl thiols, dialkyl disulfides, dialkyl sulfides, alkyl xanthates, and dialkylthiocarbamates. Examples of silanes that are suitable for functionalizing a surface (e.g., in the form of a self-assembled monolayer) include organochlorosilanes and organoalkoxysilanes. Examples of phosphonic acid molecules that are suitable for functionalizing a surface (e.g., in the form of a self-assembled monolayer) are discussed by Pellerite et al. (M. J. Pellerite, T. D. Dunbar, L. D. Boardman, and E. J. Wood, "Effects of Fluorination on Self-Assembled Monolayer Formation from Alkanephosphonic Acids on Aluminum: Kinetics and Structure," Journal of Physical Chemistry B 107 11726-11736 (2003)). Chemical species that are suitable for functionalizing a surface (e.g., in the form of a self-assembled monolayer) can include, for example, hydrocarbon compounds, partially fluorinated hydrocarbon compounds, or perfluorinated compounds. A useful self-assembled monolayer can include two or more different chemical species. In the use of two or more different chemical species, the chemical species may exist in the self-assembled monolayer as a mixture or with a phase-separated morphology. Illustrative useful molecules for functionalizing a surface (e.g., in the form of a self-assembled monolayer) include, for example, $(C_3-C_{20})$alkyl thiols, or $(C_{10}-C_{20})$alkyl thiols, or $(C_{15}-C_{20})$alkyl thiols. The alkyl groups can be linear or branched and can be substituted or unsubstituted. It is preferred that substituents do not interfere with the formation of a self-assembled monolayer.

The term "electroless deposition" refers to a process for the autocatalytic plating of metals. It involves the use of an electroless plating solution that contains a soluble form of the deposit metal together with a reducing agent. The soluble form of the deposit metal is usually an ionic species or a metal complex (i.e., a metal species coordinated to one or more ligands). Electroless deposition does not require the application of electrical current to a work piece that is being coated. The steps involved in electroless plating include the preparation of a film substrate with a catalytic surface (e.g., a metal catalyzed polymeric film substrate surface), followed by immersion of the polymeric film substrate in an appropriate plating bath. The catalytic surface catalyzes the deposition of metal from solution. Once started, plating proceeds by the continued reduction of the solution metal source, catalyzed by its own metal surface, hence the term "autocatalytic." Metallic deposits that can be formed using electroless deposition include copper, nickel, gold, silver, palladium, rhodium, ruthenium, tin, cobalt, zinc, as well as alloys of these metals with each other or with phosphorous or boron, as well as compounds of these metals with each other or with phosphorous or boron. Suitable reducing agents include, for example, formaldehyde, hydrazine, aminoboranes, and hypophosphite. Examples of suitable metal surfaces for catalysis of electroless deposition include palladium, platinum, rhodium, silver, gold, copper, nickel, cobalt, iron, and tin, as well as alloys and compounds of the elements with each other or with other elements.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", an and "the" encompass embodiments having plural referents, unless the content clearly dictates otherwise. As used in this specification and the appended claims, the term "or" is generally employed in its sense including "and/or" unless the content clearly dictates otherwise.

The term "polymer" will be understood to include polymers, copolymers (e.g., polymers formed using two or more different monomers), oligomers and combinations thereof, as well as polymers, oligomers, or copolymers that can be formed in a miscible blend.

By having a "relief pattern", what is meant is that the surface includes a topographical pattern, for example a pattern of recessed regions (e.g., channels, wells, grooves) or a pattern of raised regions (e.g., ridges, posts, hemispheres).

This disclosure relates to methods of patterning deposit metals on substrates and the deposit patterned articles. In some embodiments, the substrates are planar or featureless on both of their major surfaces and functionalizing molecules are printed as a pattern on the planar surface. In some embodiments, the substrates have a relief pattern (or structure or microstructure) on one or both of their major surfaces and the functionalizing molecules are printed on raised portions of the relief pattern to form the pattern of functionalizing molecules.

Functionalizing molecules can be selectively printed onto substrates that are planar or featureless on both of their major surfaces using a printing plate having a relief pattern. The raised portions of the printing plate relief pattern transfers functionalizing molecules selectively onto the planar substrate to form the pattern of functionalizing molecules. These printing methods are known as contact or microcontact printing and utilize elastomeric printing plates. Functionalizing molecules serve as a mask for subsequent additive patterning via, for example, electroless plating.

Polymeric film substrates with a relief pattern on a major surface are said to be structured or microstructured. The polymer film substrates can be structured by cast-and-cure microreplication or embossing as described, for example, in U.S. Pat. Nos. 5,932,150; 6,737,170; 6,788,463; and 4,576, 850. These structured film substrates can have functionalizing molecules selectively placed (or printed) on raised regions of the structured film substrate. Functionalizing molecules serve as a mask for subsequent additive patterning via, for example, electroless plating. The additive patterning yields electrolessly deposited metal selectively in the recessed regions of the relief pattern. Such patterning of the deposit metal is described as yielding a metal pattern defined by the relief pattern. In these embodiments, the printing plate having the functionalizing molecules disposed therein or thereon may be featureless and the printed pattern of functionalizing molecules on the polymeric film substrate is defined by the raised surface regions of the polymeric film substrate. By featureless, what is meant is that the plate is smooth (lacks a relief structure) on the scale of the relief structure on the film substrate surface. These embodiments allow for the placement of functionalizing molecules (e.g., self-assembled monolayers) onto polymeric film surfaces in patterns without the need to limit slippage of the plate with respect to the film substrate. In microcontact printing, the relief-structured stamp and the flat substrate are contacted and separated without slippage in order to preserve pattern fidelity. This can be challenging when attempting to continuously microcontact print very small feature sizes roll-to-roll on flexible polymeric film substrates. Roll-to-roll implementation of continuous microcontact printing with polymeric film substrates and small features sizes in the pattern (e.g., less than 10 micrometers, or less than 1 micrometer) poses some challenges in synchronization (e.g., control of web advance with respect to the printing plate rotation). The embodiments including structured polymer film substrates overcome these synchronization problems by allowing the pattern of transferred functionalizing molecules to be defined by the film substrate relief structure, rather than the combination of printing plate relief and the details of contact and release from the substrate. Also, elastomeric materials are particularly useful for transferring functionalizing molecules (e.g., self-assembled monolayers) to surfaces, but may have a tendency to deform under the printing action when structured with a fine-scale relief pattern. The embodiments including structured polymer film substrates allow the pattern of functionalizing molecules on the polymer film substrate to be defined by a potentially more rigid material (substrate itself, rather than the elastomeric printing plate), further assuring ultimate pattern fidelity for the functionalizing molecules, and in turn the deposited metal.

Useful elastomers for forming the printing plate (either featureless or having a relief pattern) include silicones, polyurethanes, EPDM rubbers, as well as the range of existing commercially available flexographic printing plate materials (e.g., commercially available from E. I. du Pont de Nemours and Company, Wilmington, Del., under the trade name Cyrel®). Polydimethylsiloxane (PDMS) is particularly useful. The plate can e made from a composite material. The elastomer can be a gel material (e.g., co-continuous liquid and solid phases), for example a hydrogel. The plate can be supported on another material, for example a more rigid material for fixing the shape and size of the plate during use. The plate can be activated during transfer of the functionalizing molecules (e.g., heated, or ultrasonically driven).

A catalytic material (e.g., metal) is deposited on the polymeric film substrate to form an activated substrate surface. The catalytic material deposit can be continuous or discontinuous and can include, for example, elemental metal, metal alloys, intermetallic compounds, metal oxides, metal sulfides, metal carbides, metal nitrides, and combinations thereof. Exemplary catalytic (e.g., metallic) surfaces that can be selectively passivated with functionalizing molecules (e.g., in the form of a self-assembled monolayer) include gold, silver, palladium, platinum, rhodium, copper, nickel, iron, indium, tin, tantalum, as well as mixtures, alloys, and compounds of these elements. Preferred catalytic materials in the present disclosure are palladium, gold, platinum, and silver. For reasons of chemical durability (e.g., resistance to corrosion), silver is less preferred than palladium, gold, or platinum. Although it can be used in the present disclosure, platinum is less preferred than palladium or gold, because its functionalization with alkyl thiols can be sluggish and often incomplete, leading to a slow printing rate and leading frequently to non-specific plating. Palladium is preferred over gold, because its very thin vapor deposits (e.g., average thickness less than 60 angstroms, or less than 50 angstroms, or less than 10 angstroms, or less than 5 angstroms) have been discovered in the present disclosure to offer a preferred combination of high optical transmittance, high catalytic activity for electroless plating, and rapid selective functionalization by contact printing, leading to highly selective, continuous electroless plating deposits wherein the deposit metal patterns can be complemented by optically transparent regions without a post-etch step. These catalytic metal coating deposits on the polymeric film substrate can be any useful average thickness such as, for example, from 1 to 75 angstroms or less than 60 angstroms, or less than 50 angstroms, or less than 10 angstroms, or less than 5 angstroms. In many embodiments, the catalytic metal coating deposits are continuous or discontinuous and have an average thickness in a range from 1 to 10 angstroms and preferably in a range from 1 to 5 angstroms. In some embodiments, the catalytic metal coating is discontinuous and has an average thickness of less than 200 angstroms, or less than 100 angstroms, or less than 75 angstroms, or less than 60 angstroms. The catalytic material coating can be deposited using any convenient method. In many embodiments, the catalytic material coating is deposited using a vapor deposition method such as, for example, sputtering, evaporation, or chemical vapor deposition.

Prior work has shown that catalytic materials deposited from liquids onto substrates may be selectively functionalized by microcontact printing with a relief-patterned stamp, and then used for the patterned electroless plating of nickel-based conductors. Liquids for depositing catalytic materials for electroless plating include solutions of metal salts and colloidal dispersions. For certain substrates, especially polymer film substrates processed roll-to-roll, solution-deposition of very thin catalytic materials can be more problematic than vapor-deposition. Specifically, solution-deposition of catalytic materials on polymer films requires contacting and then removing the liquid from the large surface area of the polymer film. In contrast, vapor deposition (e.g., evaporation, sputtering, chemical vapor deposition) can be used conveniently at high rates for the desired average thickness, without the handling of large amounts of liquid solution. Also, vapor deposition can be easily adapted for depositing a wider range of compositions for the catalytic material, including compositions that comprise a mixture of metals.

FIGS. 1A-1F is a schematic diagram of an illustrative method of patterning a deposit metal 165 on a polymeric film substrate 105. In the illustrated embodiment, the polymeric film substrate 105 has a planar or featureless major surface 104. In many embodiments a continuous or discontinuous layer of catalytic material 110 is vapor deposited 100 onto the major surface 104 at an average thickness of less than 60 angstroms, or less than 10 angstroms, or less than 5 angstroms, to form an activated substrate surface 106. In some embodiments a discontinuous layer of catalytic material 110 is deposited 100 onto the major surface 104 at an average thickness of less than 200 angstroms, or less than 60 angstroms, or less than 10 angstroms, or less than 5 angstroms, to form an activated substrate surface 106. In many of these embodiments, the discontinuous layer of catalytic material 110 is vapor deposited 100 onto the major surface 104 to form the activated substrate surface 106.

The polymeric film substrate 105 can be formed of any useful polymeric material. In many embodiments, the polymeric film substrate 105 is a transparent polymeric film substrate 105. The polymeric film substrate 105 can be prepared from a suitable polymeric material that has sufficient mechanical properties (e.g., strength and flexibility) to be processed in a roll-to-roll apparatus. Examples of such polymers include thermoplastic polymers. Examples of useful thermoplastic polymers in the present disclosure include polyolefins, polyacrylates, polyamides, polyimides, polycarbonates, polyesters, and biphenol- or naphthalane-based liquid crystal polymers. Further examples of useful thermoplastics include polyethylene, polypropylene, poly(methylmethacrylate), polycarbonate of bisphenol A, poly(vinyl chloride), polyethylene terephthalate, polyethylene naphthalate, and poly(vinylidene fluoride). Some of these polymers also have optical properties (e.g., transparency) that make them especially well-suited for certain display and sensor applications wherein they would support a patterned conductor (e.g., EMI shielding films), particularly polycarbonates and polyesters. Others of these polymers have thermal and electrical properties that make them especially well-suited for certain electrical circuit applications wherein they would support a patterned conductor (e.g., support and interconnection of electronic components), particularly polyimides and liquid crystal polymers.

In many embodiments, the continuous or discontinuous layer of catalytic material 110 that is deposited or vapor-deposited on a substrate major surface 104 has an average thickness of less than 200 angstroms, or less than 60 angstroms, or less than 10 angstroms, or less than 5 angstroms. By average thickness, what is meant is the thickness calculated by dividing the mass amount of vapor-deposited material per unit surface area (e.g., grams per square centimeter) of the substrate by the density of the material (e.g., grams per cubic centimeter). The average thickness can be determined by dissolving the material off of the substrate base and measuring the concentration of the material in the dissolving solution by atomic absorption spectroscopy (see V. Švorčík, P. Slepička, J. Švorčíková, M. Špírkova, J. Zehenter, and V. Hnatowicz, "Characterization of Evaporated and Sputtered Thin Au Layers on Poly(ethylene terephthalate)," Journal of Applied Polymer Science, 99 1698-1704 (2006). The preferred average thickness for the catalytic material is based on a number of factors. The continuous or discontinuous layer of catalytic material described herein exhibits a useful combination of optical, electrical, and chemical properties when applied in a metal patterning process based on contact-printing a functionalizing molecule mask on the catalytic material, followed by electroless plating the metal pattern. Specifically, it is desired that the deposited continuous or discontinuous layer of catalytic material allows the underlying substrate to have high sheet resistance (Rs), cause minimal reduction in photopic transmittance (Tvis) when applied to a transparent substrate, and exhibit high catalytic activity leading to a continuous electroless metal deposit.

Preferably, sheet resistance (Rs) for the vapor-deposited catalytic seed material (e.g., metal) is greater than $10^4$ ohms per square, or greater than $10^8$ ohms per square, or greater than $10^{12}$ ohms per square. For the achievement of Rs greater than $10^4$ ohms per square, catalytic material in the form of a catalytic metal is preferably discontinuous in its coverage on the substrate major surface. A discontinuous morphology was reported for thin films of gold on polyester substrate when the gold average thickness was less than approximately 40 angstroms (V. Švorčík, P. Slepička, J. Švorčíková, M. Špírkova, J. Zehenter, and V. Hnatowicz, "Characterization of Evaporated and Sputtered Thin Au Layers on Poly(ethylene terephthalate)," Journal of Applied Polymer Science, 99 1698-1704 (2006). In many embodiments, discrete areas of catalytic materials that make up a discontinuous deposit of catalytic material may have any lateral dimension, but preferred dimensions range from less than one angstrom to 1000 angstroms, or from one angstrom to 100 angstroms.

Preferably, photopic transmittance (Tvis) for a nominally transparent substrate is reduced through deposition of the catalytic material by less than 10% (e.g., reduced from a starting Tvis value of 90% to a final Tvis value of no less than 80%, for example), or less than 5% (e.g., reduced from a starting Tvis value of 90% to a final Tvis value of no less than 85%, for example), or less than 2% (e.g., reduced from a starting Tvis value of 90% to a final Tvis value of no less than 88%, for example), or less than 1% (e.g., reduced from a starting Tvis value of 90% to a final Tvis value of no less than 89%, for example). The addition of a gold thin film of average thickness 60 angstroms onto a nominally transparent substrate base (e.g., substrate base Tvis=90%) reduces Tvis by approximately 10%. Thin film coatings of gold with thickness ranging toward zero from 60 angstroms reduce the Tvis by an amount that decreases continuously from approximately 10% to 0%.

In contrast to the aforementioned motivations to use catalytic materials (e.g., metals) of decreasing thickness (e.g., for maximizing Rs or Tvis), the need for substantial catalytic activity for electroless plating motivates the use of the catalytic material with greater thickness. Surprisingly, catalytic material with average thickness of less than 60 angstroms, deposited by vapor processing according to the present disclosure, simultaneously exhibits high Rs, low impact on Tvis when placed on a transparent substrate, and high activity for electroless plating that can be masked by contact-printing of functionalizing molecules. Notwithstanding these divergent properties, a successful range of thickness has been identified. Accordingly, the average thickness of the catalytic material is less than 60 angstroms and less than 200 angstroms when the catalytic material layer is a discontinuous layer. Preferably, the average thickness is between 1 angstrom and 20 angstroms. More preferably, the average thickness is between 2 and 10 angstroms. Thickness can be determined using a quartz crystal microbalance integrated with the control system on a thin film evaporator, as described above.

The deposited catalytic material can be cleaned using a dry cleaning process. Such a cleaning process is particularly useful if the catalytic surface becomes contaminated during storage before use. Examples of useful dry cleaning processes (not shown) include UV-ozone cleaning and plasma cleaning (e.g., oxygen plasma cleaning).

A pattern of functionalizing material 131 is selectively formed or printed 111 on the activated substrate surface 106 to form functionalized regions 132 and unfunctionalized regions 133. The pattern of functionalizing material 131 can be selectively printed or applied to the activated surface 106 with a printing plate 130 having a relief pattern and that can be elastomeric. The printing plate 130 transfers the functionalizing material 131 to the activated surface 106 where the raised portions of the printing plate 130 contacts the activated surface 106. In many embodiments, the functionalizing material 131 is a self-assembled monolayer, as described above, after application to the activated surface 106.

The selectively functionalized polymeric film substrate 112 is then exposed 113 to an electroless plating solution 160 including a soluble form of a deposit metal. The deposit metal can be deposited 114 selectively on the unfunctionalized regions 133 to form a deposit metal pattern 165. In one embodiment, the deposit metal 165 includes copper and the catalytic material 110 is formed from palladium. In some embodiments, at least a portion of the functionalizing material 131 can be removed 115 after deposition of the deposit metal 165.

FIG. 2A-2H is a schematic diagram of another illustrative method of patterning a deposit material 265 on a polymeric film substrate 205. In the illustrated embodiment, the polymeric film substrate 205 has a major surface 204 having a relief pattern or structured surface. The polymeric film substrate 205 is replicated 200 with a mechanical tool 220 to form a structured polymeric film substrate 211 having a major surface 204 with a relief pattern including recessed regions 208 and adjacent raised regions 206. The mechanical tool 220 can be applied (as shown by the downward arrows) to a major surface 204 of the polymeric substrate 205. In the illustrated embodiment, the mechanical tool 220 forms relief pattern recessed regions 208 that extend into the substrate 205. In some embodiments, the recessed regions 208 are generally parallel channels having a depth in a range from 0.1 to 10 micrometers and a width in a range from 0.25 to 50 micrometers, and a distance between adjacent parallel recess regions 208 is in a range from 100 micrometers to 1 centimeter.

The polymeric film substrate 205 can be any useful polymeric material, as described above. In many embodiments, the polymeric film substrate 205 is a flexible polymeric film that can be utilized in a roll-to-roll apparatus. In some embodiments, the polymeric film substrate 205 is a flexible transparent polymeric film that can be utilized in a roll-to-roll apparatus, as described above.

A catalytic material 210 is deposited 212 on the major surface 204 including the raised regions 206 and recessed regions 208 of the polymeric film substrate 205 to form an activated substrate surface 203. In many embodiments, the catalytic material 210 is a metal layer, as described above, and is applied as described above.

A pattern of functionalizing molecules 231 is selectively formed or printed 213 on the raised regions 206 to form functionalized raised regions 232 and unfunctionalized recessed regions 233. The layer of functionalizing molecules 231 can be selectively applied to the raised regions 206 with a featureless plate 230 that can be elastomeric. The featureless plate 230 transfers the functionalizing material 231 to the raised regions 206 where the featureless plate 230 contacts the raised region 206. The featureless plate 230 does not transfer the functionalizing material 231 to the recessed regions 208 since the featureless plate 230 does not contact the surface of recessed region 208. Thus, the relief structure of the polymeric film substrate 205 dictates or defines the regions to which the functionalizing material 231 is selectively transferred to the polymeric film substrate 205. In many embodiments, the functionalizing molecules 231 are in the form of a self-assembled monolayer, as described above, after application to the activated surface 203.

The selectively functionalized polymeric film substrate 214 is then exposed 215 to an electroless plating solution 260 including a soluble form of a deposit metal. The deposit metal can be deposited 216 selectively on the unfunctionalized recessed regions 233 to form a deposit metal pattern 265. In one embodiment, the deposit metal 265 includes copper and the catalytic material 210 is formed from palladium. In some embodiments, at least a portion of the functionalizing material 231 can be removed 217 after deposition of the deposit metal 265.

In any of the embodiments, the deposit metal on the polymeric film substrate may be described as having an area shape and an area size on the polymeric film surface, as well as a thickness. In some embodiments, the area shape of the deposit metal can exhibit a regular or repeating geometric arrangement on the polymeric film, for example an array of deposit metal polygons or a pattern of deposit metal traces that define the boundaries of discrete undeposited areas that include an array of polygons. In other embodiments, the deposit metal shapes may exhibit a random arrangement on the substrate, for example a random net of traces that define the boundaries of irregular shapes for undeposited areas. In yet another embodiment, the deposit metal shapes may exhibit an arrangement that is not regular, repeating, or random, but that is a specified design which includes or lacks symmetry or repeating geometric elements. In one embodiment, a shape for the deposit metal that is useful for making a light-transmitting, EMI shielding material is a square grid, which includes traces of the deposit metal characterized by a width, thickness, and pitch. Other useful shapes for making a light-transmitting, EMI shielding material include continuous metallic traces that define open areas that have the shape of a regular hexagon (deposited metal pattern is a hexagonal net) and that are arranged in closely packed order. In order to fabricate continuous metal traces in the form a square grid, useful relief patterns for the polymeric film substrate include a square array of raised square regions (oriented parallel to the grid). In order to fabricate continuous metal traces in the form of a hexagonal net, useful relief patterns for the polymeric film substrate include a hexagonal array of raised hexagonal regions (with edges oriented parallel to the net trace directions). In summary, for fabricating EMI shielding patterns of deposited conductor, some useful relief patterns include an array of discrete raised regions each surrounded by a contiguous recessed region.

In some embodiments, the smallest area dimension for the deposit metal shapes, for example the width of a linear trace of deposit metal, can range from 100 nanometers to 1 millimeter, or from 500 nanometers to 50 micrometers, or from 1 micrometer to 25 micrometers, or from 1 micrometer to 15 micrometers, or from 0.5 to 10 micrometers. In one illustrative embodiment for making a light-transmitting EMI shielding material, the width of linear traces of deposit metal is in a range from 5 micrometers to 15 micrometers, or from 0.25 to 10 micrometers; the thickness is in a range from 0.25 to 10 micrometers, or from 1 micrometer to 5 micrometers; and the pitch is in the range from 25 micrometers to 1 millimeter, or from 100 to 500 micrometers. The largest area dimension for the deposit metal shapes above, for example the length of a linear trace of deposit metal, can range from 1 micrometer to 5 meters, or from 10 micrometers to 1 meter. For making a light-transmitting EMI shielding material, a sheet of EMI shielding material, the length of linear traces of deposit metal can be in the range from 1 centimeter to 1 meter, for example.

In some embodiments, the relief pattern of the major surface of the polymeric film substrate includes a plurality of recessed regions in the form of linear traces that are isolated from each other by a contiguous raised region. The pattern of deposited metal that can be fabricated according to the invention using the aforementioned relief pattern is useful for forming electrical circuits that are useful for supporting electronic components or for sensing applications. By linear traces, what is meant is that at least a portion of the recessed region includes a geometric feature characterized by a length that exceeds its width by a factor of at least five. A linear trace may be straight or curved, and may have an angular turn. Preferably, the linear traces have a width between 0.25 and 50 micrometers and a depth between 0.1 and 10 micrometers.

In certain applications, deposit metal patterned substrates have regions between conductive features or traces that transmit light. Examples of such applications include transparent shielding films with patterned metal structures, components for displays, and transparent sensors. A useful measure of the ability for a material, component, assembly, or device to transmit light is the photopic transmittance (Tvis). Tvis is expressed as a percentage between 0% and 100% and describes the amount of light within the visible spectrum that can pass through a material, component, assembly, or device, weighted by the photopic response function. Tvis can be measured using an optical densitometer or visible light spectrometer. Tvis is usually measured or described for essentially planar materials, components, assemblies, or devices. Visible light transmission through an essentially planar sample can be reduced by specular reflection, absorption, scattering, and waveguiding. For light that is normally incident onto a non-scattering, essentially planar sample, specular reflection and absorption dominate the Tvis properties. Specular reflection occurs for light as it passes across the flat interface between two mediums of differing index of refraction. Absorption occurs as light energy is converted to another form of energy (e.g., thermal), usually through electronic transitions or atomic vibrational transitions. Bulk metals (e.g., centimeter-sized metallic objects) are not transparent. However, when metals are prepared in the form of thin films (e.g., with thickness less than 100 nm on a polymer film substrate), light can pass through the metal thin film. The amount of light transmitted through a metal thin film is not 100%. Rather, the light is attenuated by specular reflection or absorption. In summary, the presence of a metal in the optical path for light incident on a sample material, component, assembly, or device does not necessarily eliminate the possibility of visible transmittance through the sample. Provided that the metal is thin enough, appreciable light can be transmitted.

In many applications involving a patterned conductor on the surface of a substrate, some degree of electrical isolation between conductor regions or traces is desired. Accordingly, patterned conductors are usually fabricated on electrical insulators, or dielectrics. It is possible to quantify the electrical isolation characteristics of discrete conductive regions for a conductor pattern supported on a less conductive substrate. In addition to bulk conductivity as a material property, a useful description of the electrical conduction property of a surface onto which a patterned conductor can be fabricated is the engineering term called sheet resistance, Rs. Rs is expressed in units of ohms per square. For a conductive coating, Rs is given by bulk resistivity divided by thickness. Rs for coatings on insulating substrates commonly varies over many orders of magnitude (e.g., from 0.01 to $10^{11}$ ohms per square). The minimum degree of isolation that is required between electrically conductive regions of a conductor pattern, and hence the minimum sheet resistance for the surface that supports the conductor pattern, is dependent upon application. At a minimum, for conductive patterns including a patterned conductive coating on a substrate, the sheet resistance for the substrate (optionally including one or more coatings interposed between the substrate base and the conductive pattern) should be at least one order of magnitude higher than the sheet resistance of the conductor coating that is patterned. Preferably, the sheet resistance of the substrate would be 2 orders of magnitude higher than that of the patterned conductor, or even 3, 4, 5, 6, 7, 8, 9, 10, 11, or 12 or more orders of magnitude higher. It is within the scope of the present disclosure to fabricate conductor patterns on insulating substrates that include a vapor-deposited catalyst layer where the patterned conductor regions have sheet resistance that is greater than four orders of magnitude lower than the sheet resistance of its substrate which includes the vapor-deposited catalyst material layer. Sheet resistance can be measured with non-contact eddy current probes, four-point contact probes, and static decay instruments, depending on the magnitude of the sheet resistance.

For the fabrication of wire polarizer structures having parallel deposit metal traces, the traces of deposit metal should have a width and a spacing that each are less than the wavelength of light to be polarized, or even less than one third the wavelength of the light to be polarized. For example, to polarize visible light, the traces and the spacing between traces should be less than 400 nanometers, or less than 150 nanometers. Such parallel deposit metal traces can be fabricated according to the present disclosure either on flat substrates or on structured substrates. In the latter case, the deposit metal pattern can be defined by the recessed regions of the structured substrate.

Examples

Substrate Preparation

Palladium was deposited onto a sheet of polyethylene naphthalate (available from E. I. du Pont de Nemours and Company, Wilmington, Del. under the designation TEIJIN and TEONEX Q65FA) using an evaporator (CVC Products Model SC-4500, Veeco Instruments, Inc., Woodbury, N.Y.). The thickness of the deposit was controlled using a deposition controller (Inficon Deposition Controller, Inficon, East Syracuse, N.Y.) with integrated quartz crystal microbalance sensor (Crystal Sensor 750-211-GI, Inficon, East Syracuse, N.Y.), equipped with a 6 MHz gold-coated crystal (Part No. 008-010-G10, Inficon, East Syracuse, N.Y.). The average thickness was programmed to be five angstroms. The photopic transmittance was reduced from 90% to 88% by deposition of the palladium, as measured by an optical densitometer (Jonathan Allen, Titusville, N.J.). The sheet resistance measured greater than 10,000 ohms per square before and after deposition of the palladium (Model 707B Conductance Meter, Delcon Instruments, Inc., St. Paul Park, Minn.).

Printing Functionalizing Molecules

A polydimethylsiloxane stamp (PDMS, available from Dow Corning, Inc., Midland, Mich. under the designation SYLGARD 184) measuring approximately five centimeters by five centimeters was fabricated by molding against a master tool of the same area. The master tool was a sheet of glass (Corning 1737, Corning Inc., Corning, N.Y.) supporting a pattern of photoresist (SU-8, MicroChem Corporation, Newton, Mass.). The photoresist was patterned using standard photolithography methods. The pattern of photoresist included line features of various width and spacing up to fifty micrometers. PDMS was cast against the master tool and cured for a week at room temperature, yielding a stamp with a relief-patterned surface. The relief-patterned surface of the stamp was immersed in a 7.9 mM solution of 1-hexadecylthiol functionalizing molecules (Aldrich Chemical Company, Milwaukee, Wis.) in ethyl alcohol for five minutes, yielding an inked stamp. The inked stamp was contacted to the palladium-deposited surface of the substrate for thirty seconds, yielding a printed substrate.

Patterned Electroless Plating

Figure 3:
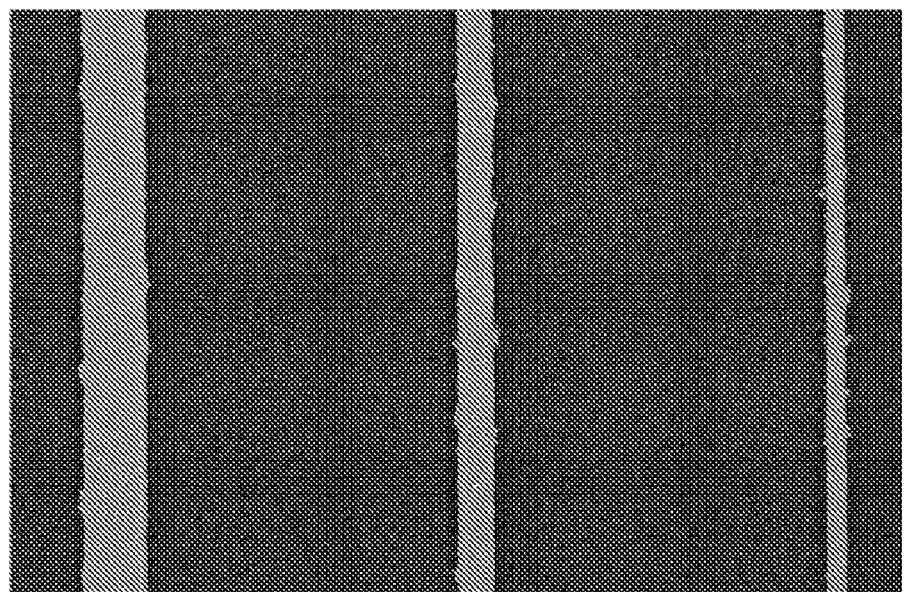
FIG. 3 is a scanning electron photomicrograph of a patterned deposit metal on a substrate formed in the Example.

The printed substrate was submerged in an electroless copper plating bath at 46 degrees Celsius (M-COPPER 85C, Mac Dermid, Inc., Waterbury, Conn.) for two minutes. Electrolessly deposited copper was selectively plated in the regions that were not printed with the functionalizing molecules, yielding a patterned-metal article. In regions not printed with functionalizing molecules, the electrolessly deposited copper metal was continuous. Regions printed with functionalizing molecules, and thus not deposited with electroless copper, remained transparent after plating. Isolated linear deposited copper features with width down to approximately two micrometers were fabricated as illustrated in the photomicrograph shown in FIG. 3 obtained using Scanning Electron Microscopy. The light regions in the photomicrograph are the deposited copper.

Thus, embodiments of the METHODS OF PATTERNING A DEPOSIT METAL ON A SUBSTRATE are disclosed. One skilled in the art will appreciate that embodiments other than those disclosed are envisioned. The disclosed embodiments are presented for purposes of illustration and not limitation, and the present invention is limited only by the claims that follow.

What is claimed is:

1. An article comprising:
a transparent polymeric film having a major surface;
a discontinuous layer of a catalytic material on the major surface, the discontinuous layer of catalytic material having an average thickness of less than 60 angstroms; and
an electrolessly deposited metal pattern on a portion of the catalytic material, wherein the deposited metal has a thickness in a range from 0.1 micrometer to 10 micrometers,
wherein at least one of the discontinuous layer of catalytic material reduces photopic transmittance Tvis of the polymeric film by less than 5% or the discontinuous layer of catalytic material has a sheet resistance of greater than $10^4$ ohms per square.

2. An article according to claim 1 wherein the discontinuous layer of catalytic material reduces photopic transmittance Tvis of the polymeric film by less than 5%.

3. An article according to claim 1 wherein the discontinuous layer of catalytic material has a sheet resistance of greater than $10^4$ ohms per square.

4. An article according to claim 1 including a pattern of functionalizing molecules, wherein the pattern of functionalizing molecules comprises functionalized and non-functionalized regions, wherein the electrolessly deposited metal is present on the non-functionalized regions, but not on the functionalized regions, and wherein the non-functionalized regions of the discontinuous layer of catalytic material are optically transparent.

5. The article of claim 1, wherein the discontinuous layer of catalytic material has an average thickness of less than 10 angstroms.

6. The article of claim 1, wherein the discontinuous layer of catalytic materials has an average thickness in a range from 1 angstrom to 5 angstroms.

7. The article of claim 1, wherein the discontinuous layer of catalytic material reduces photopic transmittance Tvis of the polymeric film by less than 2%.

8. The article of claim 1, where in the discontinuous layer of catalytic material reduces photopic transmittance Tvis of the polymeric film by less than 1%.

9. An article according to claim 1 wherein said article is a resistively heated window, electromagnetic interference (EMI) shielding, static dissipating component, antenna, touch screen for a computer display, surface electrode for an electrochromic window, surface electrode for a photovoltaic device, surface electrode for an electroluminescent device, or surface electrode for a liquid crystal display.

10. An article according to claim 9 wherein the discontinuous layer of catalytic material reduces photopic transmittance Tvis of the polymeric film by less than 5%, and wherein the discontinuous layer of catalytic material has a sheet resistance of greater than $10^4$ ohms per square.

11. An article according to claim 10 wherein the catalytic material is selected from the group of gold, silver, palladium, platinum, rhodium, copper, nickel, iron, indium, tin, and mixtures, alloys, and compounds thereof.

12. An article according to claim 10 wherein the major surface comprises a relief pattern and the metal pattern is defined by the relief pattern.

13. An article according to claim 10 wherein the polymeric film comprises a polymer selected from the group consisting of polyolefins, polyamides, polyimides, polycarbonates, polyesters, polyacrylates, poly(meth)acrylates, and liquid crystal polymers.

14. An article according to claim 10 including a pattern of functionalizing molecules, wherein the pattern of functionalizing molecules comprises functionalized and non-functionalized regions, and wherein the electrolessly deposited metal is present on the non-functionalized regions, but not on the functionalized regions.

15. An article according to claim 10 including a pattern of a self-assembled monolayer, wherein the pattern of the self-assembled monolayer comprises functionalized and non-functionalized regions, and wherein the electrolessly deposited metal is present on the non-functionalized regions, but not on the functionalized regions.

16. An article according to claim 10 wherein the discontinuous layer of catalytic material supports the metal pattern.

17. An article according to claim 10 wherein the discontinuous layer of catalytic material is light-transmitting and electrically non-conductive.

18. An article according to claim 10 wherein the polymeric film is a flat sheet that is sufficiently flexible and strong to be processed in a roll-to-roll fashion.

19. An article according to claim 18 wherein the polymeric film has a thickness in the range of from about 25 micrometers to about 500 micrometers.

* * * * *